United States Patent
Chen et al.

(10) Patent No.: US 10,883,485 B2
(45) Date of Patent: *Jan. 5, 2021

(54) DRIVING SYSTEM FOR PIEZOELECTRIC PUMP

(71) Applicant: Microjet Technology Co., Ltd., Hsinchu (TW)

(72) Inventors: Shih-Chang Chen, Hsinchu (TW); Jia-Yu Liao, Hsinchu (TW); Chi-Feng Huang, Hsinchu (TW); Wei-Ming Lee, Hsinchu (TW); Yung-Lung Han, Hsinchu (TW)

(73) Assignee: MICROJET TECHNOLOGY CO., LTD., Hsinchu (TW)

( * ) Notice: Subject to any disclaimer, the term of this patent is extended or adjusted under 35 U.S.C. 154(b) by 623 days.

This patent is subject to a terminal disclaimer.

(21) Appl. No.: 15/782,482

(22) Filed: Oct. 12, 2017

(65) Prior Publication Data
US 2018/0106245 A1    Apr. 19, 2018

(30) Foreign Application Priority Data
Oct. 13, 2016 (TW) .............................. 105133015 A

(51) Int. Cl.
*H02N 2/16* (2006.01)
*H01L 41/04* (2006.01)
(Continued)

(52) U.S. Cl.
CPC ............ *F04B 43/046* (2013.01); *F04B 35/04* (2013.01); *F04B 35/045* (2013.01); *H01L 41/042* (2013.01); *H02N 2/06* (2013.01)

(58) Field of Classification Search
CPC ...... F04B 43/046; F04B 35/045; F04B 35/04; H02N 2/06; H01L 41/042
See application file for complete search history.

(56) References Cited

U.S. PATENT DOCUMENTS 7,484,940 B2    2/2009  O'Neill
10,680,157 B2 *  6/2020  Chen .................... F04B 49/06
(Continued)

FOREIGN PATENT DOCUMENTS

CN        100536310 C    9/2009
CN          1906843 B    9/2010
(Continued)

OTHER PUBLICATIONS

Indian Office Action for Indian Application No. 201724036297, dated Feb. 12, 2020, with English translation.

*Primary Examiner* — J. San Martin
(74) *Attorney, Agent, or Firm* — Birch, Stewart, Kolasch & Birch, LLP

(57) ABSTRACT

A driving system includes a voltage conversion module, a frequency control module, a voltage switching module and a detecting module. The voltage conversion module is used for converting a first DC voltage into a second DC voltage. The frequency control module searches a resonant working frequency of a piezoelectric actuator through circuit oscillation and generates a switching signal according to the resonant working frequency. According to the switching signal, the voltage switching module converts the second DC voltage into an AC voltage so as to drive the piezoelectric actuator. The detecting module includes a gas pressure sensor and a microcontroller. The gas pressure sensor generates a detected gas pressure value according to a result of detecting a gas pressure of the piezoelectric pump. The microcontroller controls the voltage conversion module to adjust the output voltage. Consequently, the gas pressure of the piezoelectric pump is adjusted.

14 Claims, 2 Drawing Sheets

(51) Int. Cl.
*F04B 43/04* (2006.01)
*F04B 35/04* (2006.01)
*H02N 2/06* (2006.01)

(56) References Cited

U.S. PATENT DOCUMENTS

| | | |
|---|---|---|
| 2005/0231069 A1 | 10/2005 | Yamazaki et al. |
| 2007/0216256 A1 | 9/2007 | Vogeley |
| 2011/0256004 A1 | 10/2011 | Vogeley et al. |
| 2013/0336035 A1 | 12/2013 | Ramabhadran et al. |
| 2018/0108825 A1* | 4/2018 | Chen .................. F04B 49/06 |

FOREIGN PATENT DOCUMENTS

| | | |
|---|---|---|
| CN | 1898855 B | 10/2010 |
| EP | 1737114 A1 | 12/2006 |
| EP | 2469089 A1 | 6/2012 |
| EP | 2648324 A2 | 10/2013 |
| JP | S62186077 A | 8/1987 |
| JP | 2006033907 A | 2/2006 |
| JP | 2007533902 A | 11/2007 |
| JP | 2013220012 A | 10/2013 |
| JP | 2014500442 A | 1/2014 |
| TW | 201403898 A | 1/2014 |
| WO | 2005086337 A1 | 9/2005 |
| WO | 2005088823 A1 | 9/2005 |

* cited by examiner

DRIVING SYSTEM FOR PIEZOELECTRIC PUMP

FIELD OF THE INVENTION

The present invention relates to a driving system, and more particularly to a driving system for providing a variable output voltage and controlling a variable working frequency of a piezoelectric actuator of a piezoelectric pump.

BACKGROUND OF THE INVENTION

During operation of a piezoelectric pump, a driving system provides electric energy to drive a piezoelectric actuator of the piezoelectric pump. Consequently, the piezoelectric actuator performs a cyclic action to drive the operation of the piezoelectric pump.

Conventionally, there are three kinds of driving systems for driving the piezoelectric pump. The first driving system provides a fixed output voltage and controls a fixed working frequency of the piezoelectric actuator. The second driving system provides a variable output voltage and controls a fixed working frequency of the piezoelectric actuator. The third driving system provides a fixed output voltage and controls a variable working frequency of the piezoelectric actuator.

However, the above-mentioned driving systems have drawbacks respectively. Regarding the first driving system, each piezoelectric pump actually has different characteristic due to different design of structure, size, thickness of the piezoelectric plate, or assembling tolerance. As a result, when being applied to the fixed output voltage and being operated at the fixed frequency, piezoelectric pumps would output different gas pressure. Thus, the first driving system causes difficulty in precisely control the performance and the output flowrate of different piezoelectric pumps.

Regarding the second driving system, the problem is poor compatibility. As mentioned, the structure design and the thickness of the piezoelectric plate affect physical characteristics of piezoelectric pumps, so each type of piezoelectric pumps has an optimal working frequency. However, the second driving system fails to operate the different types of piezoelectric pumps at their optimal working frequencies. For instance, the optimal working frequencies of three different kinds of piezoelectric pumps are 100 kHz, 105 kHz, and 95 kHz respectively. The second driving system controls the piezoelectric actuators of these three kinds of piezoelectric pumps to work at a fixed working frequency, which is approximately average of their optimal working frequencies, e.g., 100 kHz. Under this circumstance, a higher voltage or a lower voltage is required to drive the piezoelectric pumps that have the optimal working frequencies of 105 kHz and 95 kHz. However, if the output voltage is too high, the piezoelectric property of the piezoelectric actuator may be lost and thus the piezoelectric pump is damaged.

Regarding the third driving system, it results in the abrupt increase or decrease of the performance of the piezoelectric pump and narrows the range of the controllable working frequency of the piezoelectric pump. Thus, applicability of the third driving system is quite limited.

Therefore, there is a need of providing an improved driving system for a piezoelectric pump in order to overcome the above drawbacks.

SUMMARY OF THE INVENTION

An object of the present invention is to provide a driving system for a piezoelectric pump in order to overcome the drawbacks of the conventional technologies. As previously described, the driving system providing the fixed frequency and the fixed voltage, the driving system providing the fixed frequency and the variable voltage, as well as the driving system providing the variable frequency and the fixed voltage, all have respectively drawbacks. For example, the performance and the output flowrate of the piezoelectric pump are not precisely controlled, the piezoelectric pump is easily damaged, or having poor applicability upon different types of piezoelectric pumps. For solving the above drawbacks, the driving system of the present invention provides a variable output voltage and controls a variable working frequency of the piezoelectric actuator, consequently providing improved compatibility, usability and performance.

In accordance with an aspect of the present invention, there is provided a driving system for driving a piezoelectric actuator of a piezoelectric pump. The piezoelectric actuator includes a first terminal and a second terminal. The driving system includes a voltage conversion module, a frequency control module, a voltage switching module, a voltage dividing module, and a detecting module. The voltage conversion module is used for converting a first DC voltage into a second DC voltage. The frequency control module is electrically connected to the voltage conversion module and the piezoelectric actuator. The frequency control module searches a resonant working frequency of the piezoelectric actuator through circuit oscillation and accordingly generates a switching signal. The voltage switching module is electrically connected to the frequency control module. According to the switching signal, the voltage switching module converts the second DC voltage into an AC voltage so as to drive the piezoelectric actuator. The voltage dividing module is electrically connected to the voltage conversion module. The detecting module includes a gas pressure sensor and a microcontroller, wherein the gas pressure sensor is configured to detect a gas pressure of the piezoelectric pump and accordingly outputs plural detected gas pressure values. The microcontroller is electrically connected to the gas pressure sensor and the voltage dividing module to implement the following actions: acquiring an actual gas pressure change amount of the piezoelectric pump within a specified time interval by calculating the detected gas pressure values; issuing an adjusting signal to the voltage conversion module according to a result of comparing the actual gas pressure change amount with a predetermined gas pressure change amount. Then the voltage conversion module adjusts the second DC voltage according to the adjusting signal. Consequently, the gas pressure of the piezoelectric pump is correspondingly adjusted to make the actual gas pressure change amount approaching to the predetermined gas pressure change amount.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
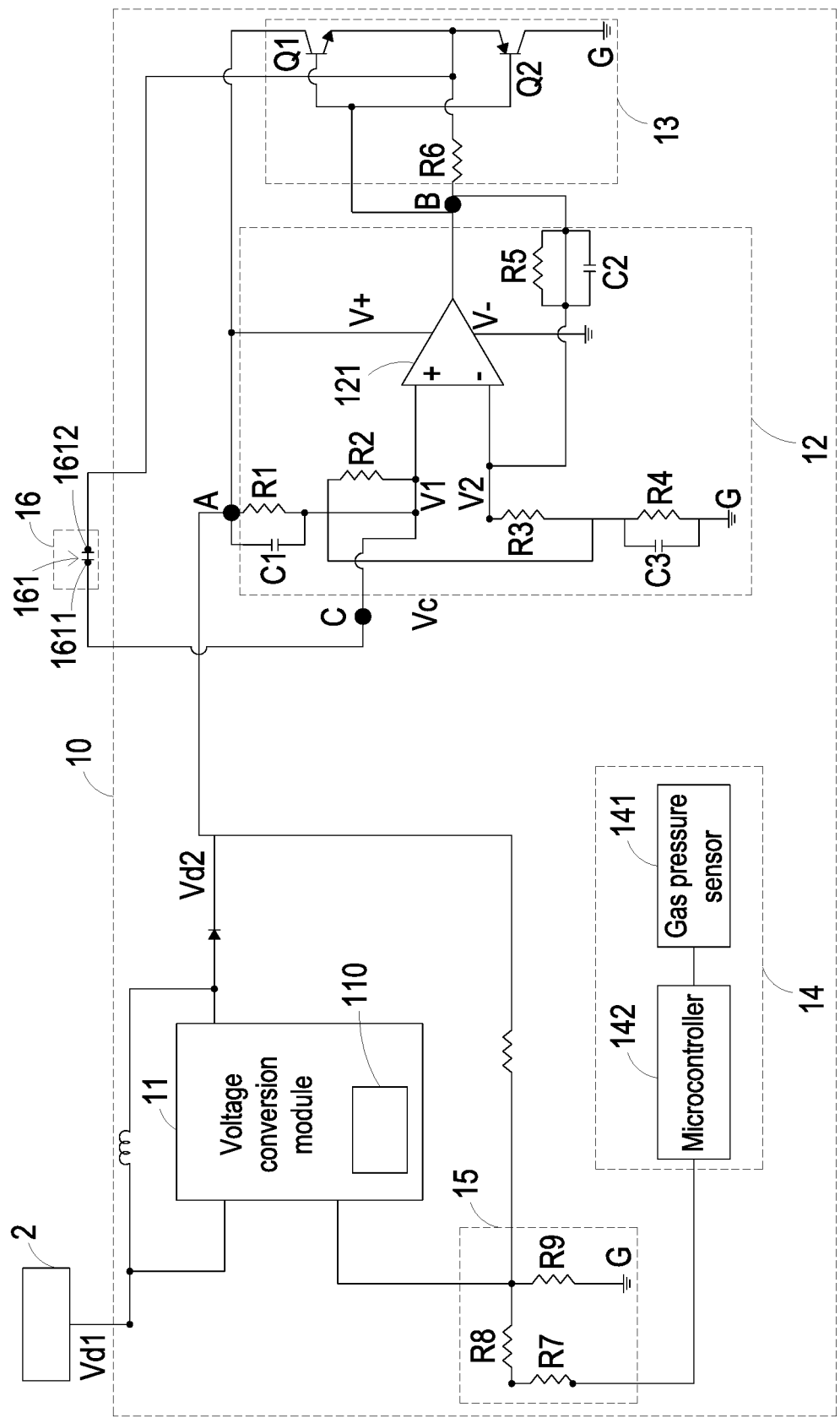
FIG. 1 is a schematic circuit diagram illustrating a driving system according to an embodiment of the present invention.

FIG. 1 is a schematic circuit diagram illustrating a driving system according to an embodiment of the present invention. As shown in FIG. 1, the driving system 10 is used for driving a piezoelectric actuator 161 of a piezoelectric pump 16. In this embodiment, the driving system 10 comprises a voltage conversion module 11, a frequency control module 12, a voltage switching module 13, a detecting module 14 and a voltage dividing module 15.

Preferably but not exclusively, the voltage conversion module 11 is a boost converter, and has an input terminal and an output terminal. After receiving a first DC voltage Vd1 generated by a power source 2 via the input terminal, the voltage conversion module 11 converts the first DC voltage Vd1 into a second DC voltage Vd2 and outputs the second DC voltage Vd2 from the output terminal.

The frequency control module 12 is electrically connected to the output terminal of the voltage conversion module 11 and the piezoelectric actuator 161. The frequency control module 12 searches a resonant working frequency of the piezoelectric actuator 161 through the circuit oscillation and generates a corresponding switching signal according to the resonant working frequency.

The voltage switching module 13 is electrically connected to the output terminal of the voltage conversion module 11, the frequency control module 12 and the piezoelectric actuator 161. The voltage switching module 13 is selectively turned on or turned off according to the switching signal. When the voltage switching module 13 is turned on, it converts the second DC voltage Vd2 into an AC voltage so as to drive the operation of the piezoelectric actuator 161 at the resonant working frequency.

The voltage dividing module 15 is electrically connected between the voltage conversion module 11 and the detecting module 14, dividing the voltages of output signals from the microcontroller 10 and providing the processed signals to the voltage conversion module 11.

The detecting module 14 comprises a gas pressure sensor 141 and a microcontroller 142. The gas pressure sensor 141 is configured to close to or to be inside the piezoelectric pump 5 so as to detect the gas pressure of the piezoelectric pump 16 and accordingly generates plural detected gas pressure values. The microcontroller 142 previously stores a predetermined gas pressure change amount, and is electrically connected to the gas pressure sensor 141 and the voltage dividing module 15. By calculating the detected gas pressure values within a specified time interval from the gas pressure sensor 141, the microcontroller 142 obtains an actual gas pressure change amount of the piezoelectric pump 16 within the specified time interval. Moreover, the microcontroller 142 issues an adjusting signal to the voltage dividing module 15 according to a result of comparing the actual gas pressure change amount with the predetermined gas pressure change amount. Preferably but not exclusively, the adjusting signal is a pulse width modulation (PWM) signal. After the adjusting signal from the detecting module 14 is subjected to voltage division by the voltage dividing module 15, the voltage-divided adjusting signal is sent to the voltage conversion module 11 by which the second DC voltage Vd2 is accordingly adjusted. Since the gas pressure in the piezoelectric pump 16 is correspondingly adjusted, the actual gas pressure change amount approaches the predetermined gas pressure change amount.

To sum up, the frequency control module 12 can search the resonant working frequency of the piezoelectric actuator 161 through the circuit oscillation, therefore making the piezoelectric actuator 161 operating at the resonant working frequency. That is, the driving system 10 is capable of automatically adjusting the working frequency of the piezoelectric actuator 161 to an optimum working frequency for matching each piezoelectric actuator 161 with different characteristics. Moreover, the microcontroller 142 generates the adjusting signal according to the result of comparing the actual gas pressure change amount with the predetermined gas pressure change amount. The voltage conversion module 11 adjusts the second DC voltage Vd2 according to the adjusting signal, as a result, the gas pressure in the piezoelectric pump 16 is correspondingly adjusted, and the actual gas pressure change amount is adjusted to be close to the predetermined gas pressure change amount. Although each piezoelectric pump 16 has different characteristic and structure, the driving system 10 of the present invention is still capable of adjusting the actual gas pressure change amount to be close to the predetermined gas pressure change amount. Thus, the present invention has better applicability than conventional technologies. The driving system 10 is able to output the variable second DC voltage Vd2 to the piezoelectric actuator 161 and control the working frequency of the piezoelectric actuator 161 according to the characteristics of the piezoelectric actuator 161. Thus, the driving system 10 of the present invention can precisely control the performance and the output flowrate of the piezoelectric pump 16, avoid damage of the piezoelectric pump 16 and increase the applicability of the piezoelectric pump 16. In other words, the driving system 10 of the present invention can overcome the drawbacks of the conventional technologies.

Please refer to FIG. 1 again. The frequency control module 12 comprises an input terminal A, an output terminal B, a receiving terminal C and a control circuit. The input terminal A receives the second DC voltage Vd2 from the voltage conversion module 11; the output terminal B is electrically connected to the voltage switching module 13; and the receiving terminal C is electrically connected to a first terminal 1611 of the piezoelectric actuator 161 to receive a micro voltage Vc from the piezoelectric actuator 161. Moreover, the control circuit is divided after the input terminal A and generates a first voltage V1 and a second voltage V2. The frequency control module 12 compares the first voltage V1 with the second voltage V2 and accordingly outputs an output voltage as the switching signal according to the result of comparison. The output voltage may be a positive voltage V+ or a negative voltage V−.

The voltage switching module 13 has an input terminal and an output terminal, while the input terminal is electrically connected to the output terminal B, therefore receiving the output voltage which may be the positive voltage V+ or the negative voltage V− from the frequency control module 12. The output terminal of the voltage switching module 13 is electrically connected to a second terminal 1612 of the piezoelectric actuator 161 for transmitting the output voltage to the piezoelectric actuator 161. In case that the second terminal 1612 of the piezoelectric actuator 161 has the positive voltage V+, the micro voltage Vc from the first terminal 1611 of the piezoelectric actuator 161 has the negative voltage V−. In case that the second terminal 1612 of the piezoelectric actuator 161 has the negative voltage V−, the micro voltage Vc from the first terminal 1611 of the piezoelectric actuator 161 has the positive voltage V+. The frequency control module 12 and the voltage switching module 13 control an oscillation voltage matching the piezoelectric actuator 161 according to the change of the micro voltage Vc.

In an embodiment, the control circuit of the frequency control module 12 comprises a frequency adjusting circuit, an input terminal voltage regulator, a voltage divider and a comparator 121. The frequency adjusting circuit comprises a first resistor R1 and a first capacitor C1, which are connected to each other in parallel. A first terminal of the frequency adjusting circuit is electrically connected to the input terminal A of the frequency control module 12 so as to receive the second DC voltage Vd2 from the voltage conversion module 11. A second terminal of the frequency adjusting circuit is electrically connected to the comparator 121 and the receiving terminal C of the frequency control module 12. The receiving terminal C of the frequency control module 12 is electrically connected to the first terminal 1611 of the piezoelectric actuator 161.

The voltage divider comprises a first voltage generation circuit and a second voltage generation circuit, wherein the first voltage generation circuit comprises a second resistor R2 and generates the first voltage V1, and the second voltage generation circuit comprises a third resistor R3 and generates the second voltage V2. A first terminal of the first voltage generation circuit is electrically connected to a segment of the frequency control module 12 in which between the receiving terminal C and the comparator 121. Meanwhile, a first terminal of the second voltage generation circuit is electrically connected to a second terminal of the first voltage generation circuit, and a second terminal of the second voltage generation circuit is electrically connected to the comparator 121. The voltage divider inputs the first voltage V1 and the second voltage V2 into the comparator 121.

The input terminal voltage regulator comprises a fourth resistor R4 and a third capacitor C3, which are connected to each other in parallel. A first terminal of the input terminal voltage regulator is electrically connected to the second voltage generation circuit of the voltage divider, and a second terminal of the input terminal voltage regulator is electrically connected to a ground terminal G The second DC voltage Vd2 from the voltage conversion module 11 is stabilized by the input terminal voltage regulator.

The comparator 121 comprises a positive input terminal, a negative input terminal, and an output terminal. The positive input terminal of the comparator 121 is electrically connected to the input terminal A of the frequency control module 12 through the frequency adjusting circuit. Moreover, the positive input terminal of the comparator 121 is electrically connected to the first voltage generation circuit to receive the first voltage V1. The negative input terminal of the comparator 121 is electrically connected to the second voltage generation circuit to receive the second voltage V2. The output terminal of the comparator 121 is electrically connected to the output terminal B of the frequency control module 12. The voltage divider inputs the first voltage V1 and the second voltage V2 into the positive input terminal and the negative input terminal of the comparator 121 respectively. The comparator 121 compares the first voltage V1 with the second voltage V2, and accordingly outputs the output voltage which may be the positive voltage V+ or the negative voltage V− as the switching signal. The first voltage generation circuit is also electrically connected to the first terminal 1611 of the piezoelectric actuator 161 to receive the micro voltage Vc.

In some embodiments of the present invention, the control circuit further comprises an output terminal voltage regulator, comprising a fifth resistor R5 and a second capacitor C2 connected to each other in parallel. A first terminal of the output terminal voltage regulator is connected to the second voltage generation circuit, and a second terminal of the output terminal voltage regulator is connected to the output terminal B of the frequency control module 12. The positive voltage V+ or the negative voltage V− as the switching signal outputted from the frequency control module 12 is stabilized by the output terminal voltage regulator.

The comparator 121 of the frequency control module 12 receives and compares the first voltage V1 and the second voltage V2. According to the result of comparison, the comparator 121 selectively outputs the output voltage which may be the positive voltage V+ or the negative voltage V−. If the first voltage V1 is higher than the second voltage V2, the comparator 121 outputs the positive voltage V+. If the first voltage V1 is lower than the second voltage V2, the comparator 121 outputs the negative voltage V−.

It is noted that the circuitry of the frequency control module 12 is not restricted. The frequency control module 12 as shown in FIG. 1 is presented herein for purpose of illustration and description only. The other frequency control modules used in the driving system of the general piezoelectric pump are also applicable to the present invention.

In an embodiment of the present invention, the voltage switching module 13 comprises a sixth resistor R6, a first switch Q1 and a second switch Q2. The sixth resistor R6 is used for achieving a voltage-stabilizing function and a current-limiting function of the voltage switching module 13. A first terminal of the sixth resistor R6 is connected to the output terminal B of the frequency control module 12. A second terminal of the sixth resistor R6 is connected to the second terminal 1612 of the piezoelectric actuator 161. The input terminal of the first switch Q1 and the input terminal of the second switch Q2 are connected to the output terminal B of the frequency control module 12. The output terminal of the first switch Q1 and the output terminal of the second switch Q2 are connected to the second terminal 1612 of the piezoelectric actuator 161. A control terminal of the first switch Q1 is connected to the input terminal A of the frequency control module 12 to receive the second DC voltage Vd2 from the voltage conversion module 11. A control terminal of the second switch Q2 is connected to the ground terminal G In other words, the voltage switching module 13 has a half-bridge transformer circuitry.

The operations of the frequency control module 12 and the voltage switching module 13 will be described as follows. When the operation of the piezoelectric pump 16 is about to start, the frequency control module 12 receives the second DC voltage Vd2 from the voltage conversion module 11 and the control circuit of the frequency control module 12 generates the first voltage V1 and the second voltage V2. The first voltage V1 and the second voltage V2 are respectively inputted into the comparator 121 by which the two voltages are compared. Consequently, the comparator 121 selectively outputs the positive voltage V+ or the negative voltage V− according to the result of comparing the first voltage V1 with the second voltage V2.

If the first voltage V1 is higher than the second voltage V2, the comparator 121 outputs the positive voltage V+. In response to the positive voltage V+, the first switch Q1 is turned on and the second switch Q2 is turned off. Moreover, the positive voltage V+ is transmitted from the voltage switching module 13 to the second terminal 1612 of the piezoelectric actuator 161. Meanwhile, the first terminal of the piezoelectric actuator 161 has the negative voltage V− with a small voltage drop. That is, the negative voltage V− is the on voltage of the piezoelectric actuator 161, and the piezoelectric actuator 161 has the negative voltage output. The negative voltage V− is transmitted to the positive input terminal of the comparator 121 through the first voltage generation circuit. That is, the negative voltage V− is served as the input of the comparator 121. Then, the comparator 121 compares the negative voltage V− with the second voltage V2. Since the on voltage of the piezoelectric actuator 161 (i.e., the negative voltage V−) has the voltage drop, the frequency adjusting circuit can automatically detect the resonant working frequency of the micro voltage Vc from the first terminal 1611 of the piezoelectric actuator 161, by the first resistor R1 and the first capacitor C1 coupled in parallel with each other. Consequently, the working frequency of the piezoelectric actuator 161 is adjusted to the optimum working frequency.

Afterwards, the negative voltage V− with a small voltage drop is inputted into the positive input terminal of the comparator 121. When the comparator 121 decides the first voltage V1 is lower than the second voltage V2, it outputs the negative voltage V−. In response to the negative voltage V−, the second switch Q2 is turned on, and the first switch Q1 is turned off. The negative voltage V− is transmitted from the voltage switching module 13 to the second terminal 1612 of the piezoelectric actuator 161. Meanwhile, the first terminal of the piezoelectric actuator 161 has the positive voltage V+ with a small voltage drop. That is, the positive voltage V+ is the on voltage of the piezoelectric actuator 161, and the piezoelectric actuator 161 has the positive voltage output. The positive voltage V+ is transmitted to the positive input terminal of the comparator 121 through the first voltage generation circuit. That is, the positive voltage V+ is served as the input of the comparator 121. Then, the comparator 121 compares the positive voltage V+ with the second voltage V2.

The above process is repeatedly done. As a result, an oscillation circuit adapted to respond the change of the micro voltage Vc is formed by the frequency control module 12 and the voltage switching module 13. Consequently, the piezoelectric actuator 161 can transform the electric energy into the mechanical energy to drive the operation of the piezoelectric pump 16. Similarly, the working frequency of the piezoelectric actuator 161 is automatically detected and adjusted to the desired working frequency by the frequency adjusting circuit having the first resistor R1 and the first capacitor C1 coupled in parallel with each other. Consequently, the piezoelectric actuator 161 is operated at the optimal working frequency.

Please refer to FIG. 1 again. The voltage dividing module 15 comprises a seventh resistor R7, an eighth resistor R8 and a ninth resistor R9. A first terminal of the seventh resistor R7 is electrically connected to the microcontroller 142 to receive the adjusting signal. A first terminal of the eighth resistor R8 is electrically connected to a second terminal of the seventh resistor R7. A second terminal of the eighth resistor R8 is electrically connected to the voltage conversion module 11. A first terminal of the ninth resistor R9 is electrically connected to the second terminal of the eighth resistor R8 and the voltage conversion module 11. A second terminal of the ninth resistor R9 is electrically connected to the ground terminal G.

In an embodiment, the second DC voltage Vd2 from the voltage conversion module 11 is controlled by the microcontroller 142 in a nonrevertive control manner, which means the adjusting signal from the microcontroller 142 is at a voltage that is directly proportional to the second DC voltage Vd2 from the voltage conversion module 11. In other words, as the voltage level of the adjusting signal from the microcontroller 142 increases, the voltage level of the second DC voltage Vd2 from the voltage conversion module 11 also increases. In another embodiment, the second DC voltage Vd2 from the voltage conversion module 11 may be controlled by the microcontroller 142 in a revertive control manner, which means the adjusting signal from the microcontroller 142 is at a voltage that is inversely proportional to the second DC voltage Vd2 from the voltage conversion module 11. In other words, as the voltage level of the adjusting signal from the microcontroller 142 decreases, the voltage level of the second DC voltage Vd2 from the voltage conversion module 11 increases oppositely.

Please refer to FIG. 1 again. The voltage conversion module 11 further comprises a mode switch 110. When the mode switch 110 is turned on, the mode switch 110 is in a normal working mode, converting the received first DC voltage Vd1 into the second DC voltage Vd2. Otherwise, when the mode switch 110 is turned off, the voltage conversion module 11 is in a disabling mode in which the voltage conversion module 11 stops adjusting the second DC voltage Vd2 or the voltage conversion module 11 is disabled. In case that the voltage conversion module 11 comprises the mode switch 110, the microcontroller 142 further issues a mode-switching signal. If the microcontroller 142 receives a control command or the microcontroller 142 judges that the actual gas pressure change amount is equal to the predetermined gas pressure change amount, the microcontroller 142 issues the mode-switching signal to turn off the mode switch 110. Consequently, the voltage conversion module 11 is in the disabling mode. In other situations, the microcontroller 142 issues the mode-switching signal to turn on the mode switch 110.

Figure 2:
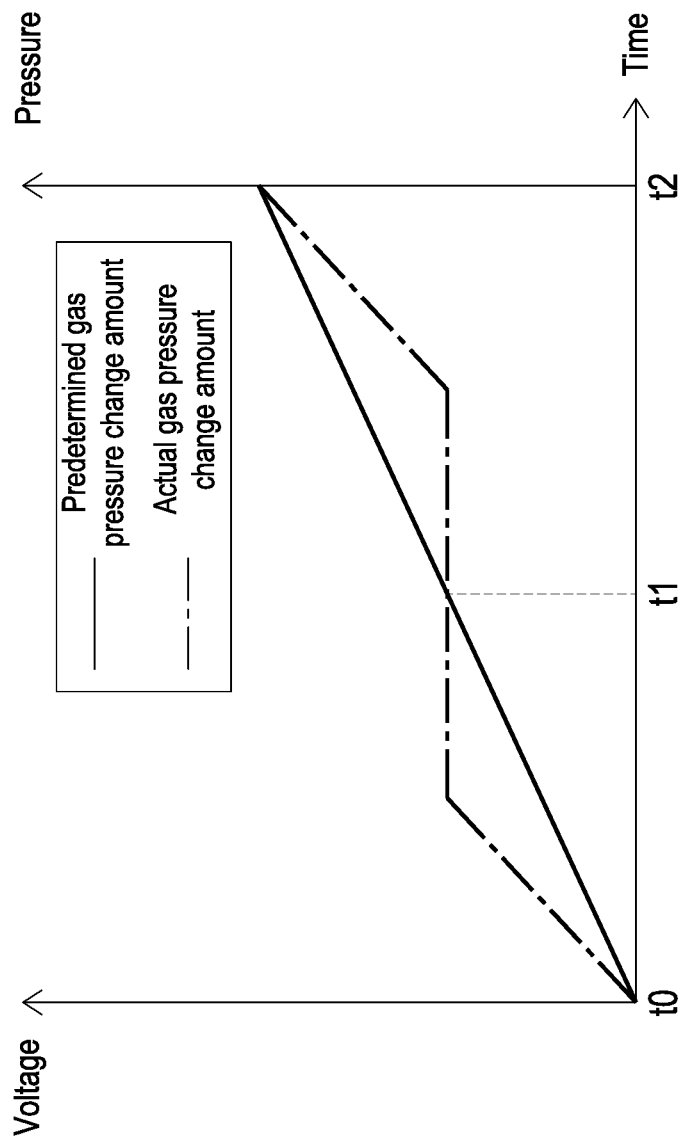
FIG. 2 is a plot illustrating the relationship between the actual gas pressure change amount and the predetermined gas pressure change amount.

FIG. 2 is a plot illustrating the relationship between the actual gas pressure change amount and the predetermined gas pressure change amount. The gas pressure sensor 141 is configured to detect the gas pressure of the piezoelectric pump 16. According to the detecting result, the gas pressure sensor 141 generates detected gas pressure values corresponding to each unit of time within a specified time interval. By calculating the detected gas pressure values from the gas pressure sensor 141, the microcontroller 142 obtains an actual gas pressure change amount of the piezoelectric pump 16 within the specified time interval (e.g., the time interval between t0 and t1 and the time interval between t1 and t2). Moreover, the microcontroller 142 issues the adjusting signal according to the result of comparing the actual gas pressure change amount with the predetermined gas pressure change amount.

In the time interval between t0 and t1, the actual gas pressure change amount is greater than the predetermined gas pressure change amount, so the microcontroller 142 issues the adjusting signal to control the voltage conversion module 11 to decrease the second DC voltage. In the time interval between t1 and t2, the actual gas pressure change amount is less than the predetermined gas pressure change amount. The microcontroller 142 issues the adjusting signal to control the voltage conversion module 11 to increase the second DC voltage. Consequently, the actual gas pressure change amount is adjusted to approaching to the predetermined gas pressure change amount.

From the above descriptions, the present invention provides a driving system for driving a piezoelectric actuator of a piezoelectric pump. The frequency control module of the driving system searches a resonant working frequency of the piezoelectric actuator through circuit oscillation. Moreover, the working frequency of the piezoelectric actuator is automatically adjusted to the optimum working frequency by the driving system according to the characteristics of the piezoelectric actuator. In other words, the working frequency of the piezoelectric actuator is variable. The microcontroller of the driving system controls the voltage switching module to adjust the output voltage according to the comparison result of the actual gas pressure change amount and the predetermined gas pressure change amount. Consequently, the gas pressure in the piezoelectric pump is adjusted, and the actual gas pressure change amount is adjusted to be close to the predetermined gas pressure change amount. The driving system of the present invention is able to output the variable voltage to the piezoelectric actuator and control the variable working frequency of the piezoelectric actuator. The driving system of the present invention can precisely control the performance and the output flowrate of the piezoelectric pump, avoid damage of the piezoelectric pump and increase the applicability of the piezoelectric pump.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A driving system for driving a piezoelectric actuator of a piezoelectric pump, the piezoelectric actuator having a first terminal and a second terminal, the driving system comprising:
   a voltage conversion module converting a first DC voltage into a second DC voltage;
   a frequency control module electrically connected to the voltage conversion module and the piezoelectric actuator, wherein the frequency control module searches a resonant working frequency of the piezoelectric actuator through circuit oscillation and generates a switching signal according to the resonant working frequency;
   a voltage switching module electrically connected to the frequency control module, converting the second DC voltage into an AC voltage according to the switching signal so as to drive the piezoelectric actuator;
   a voltage dividing module electrically connected to the voltage conversion module; and
   a detecting module comprising a gas pressure sensor and a microcontroller, wherein the gas pressure sensor is configured to detect a gas pressure of the piezoelectric pump and accordingly outputs plural detected gas pressure values, wherein the microcontroller is electrically connected to the gas pressure sensor and the voltage dividing module to implement actions comprising: acquiring an actual gas pressure change amount of the piezoelectric pump within a specified time interval by calculating the detected gas pressure values; issuing an adjusting signal to the voltage conversion module according to a result of comparing the actual gas pressure change amount with a predetermined gas pressure change amount;
   wherein the voltage conversion module adjusts the second DC voltage according to the adjusting signal, so that the gas pressure of the piezoelectric pump is correspondingly adjusted to make the actual gas pressure change amount approaching to the predetermined gas pressure change amount.

2. The driving system according to claim 1, wherein the adjusting signal from the microcontroller is at a voltage that is directly proportional to the second DC voltage from the voltage conversion module.

3. The driving system according to claim 1, wherein the adjusting signal from the microcontroller is at a voltage that is inversely proportional to the second DC voltage from the voltage conversion module.

4. The driving system according to claim 1, wherein the adjusting signal is a pulse width modulation signal.

5. The driving system according to claim 1, wherein if the actual gas pressure change amount is greater than the predetermined gas pressure change amount, the microcontroller issues the adjusting signal to control the voltage conversion module to decrease the second DC voltage, wherein if the actual gas pressure change amount is less than the predetermined gas pressure change amount, the microcontroller issues the adjusting signal to control the voltage conversion module to increase the second DC voltage.

6. The driving system according to claim 1, wherein the voltage conversion module further comprises a mode switch, wherein when the mode switch is turned off, the voltage conversion module stops adjusting the second DC voltage or the voltage conversion module is disabled.

7. The driving system according to claim 1, wherein the frequency control module comprises:
   an input terminal receiving the second DC voltage from the voltage conversion module;
   an output terminal electrically connected to the voltage switching module;
   a receiving terminal electrically connected to the first terminal of the piezoelectric actuator to receive a micro voltage from the piezoelectric actuator; and
   a control circuit comprising:
      a comparator;
      a voltage divider, a first terminal of which is electrically connected to the receiving terminal of the frequency control module, and a second terminal of which is electrically connected to the comparator wherein the voltage divider is divided into a first voltage generation circuit and a second voltage generation circuit;
      a frequency adjusting circuit, a first terminal of which is electrically connected to the input terminal of the frequency control module, and a second terminal of which is electrically connected to the voltage divider; and
      an input terminal voltage regulator.

8. The driving system according to claim 7, wherein the frequency adjusting circuit of the control circuit comprises a first resistor and a first capacitor which are connected to each other in parallel, wherein the second terminal of the frequency adjusting circuit is further electrically connected to the comparator and the receiving terminal of the frequency control module.

9. The driving system according to claim 7, wherein the voltage divider of the control circuit further comprises a second resistor and a third resistor, wherein the first voltage generation circuit comprises the second resistor, generates a first voltage, and a first terminal of the first voltage generation circuit is electrically connected to a segment of the frequency adjusting circuit between the receiving terminal and the comparator, wherein the second voltage generation circuit comprises the third resistor, generates a second voltage, a first terminal of the second voltage generation circuit is electrically connected to a second terminal of the first voltage generation circuit, and a second terminal of the second voltage generation circuit is electrically connected to the comparator, wherein the voltage divider inputs the first voltage and the second voltage into the comparator.

10. The driving system according to claim 7, wherein the input terminal voltage regulator of the control circuit comprises a fourth resistor and a third capacitor which are connected to each other in parallel, wherein a first terminal of the input terminal voltage regulator is electrically connected to the second voltage generation circuit of the voltage divider, a second terminal of the input terminal voltage regulator is electrically connected to a ground terminal, and the second DC voltage from the voltage conversion module is stabilized by the input terminal voltage regulator.

11. The driving system according to claim 9, wherein the comparator comprises:
- a positive input terminal, electrically connected to the input terminal of the frequency control module through the frequency adjusting circuit and electrically connected to the first voltage generation circuit to receive the first voltage;
- a negative input terminal, electrically connected to the second voltage generation circuit to receive the second voltage; and
- an output terminal, electrically connected to the output terminal of the frequency control module;
- wherein the comparator compares the first voltage with the second voltage and accordingly outputs an output voltage as the switching signal to the piezoelectric actuator, the piezoelectric actuator outputs the output voltage to the positive input terminal of the comparator, and the comparator compares the output voltage with the second voltage inputted by the negative input terminal to accordingly output the output voltage as the switching signal, wherein the output voltage is a positive voltage or a negative voltage, wherein the frequency adjusting circuit and the voltage switching module control an oscillation voltage matching the piezoelectric actuator, wherein the frequency adjusting circuit automatically detects and adjusts the change of the micro voltage of the piezoelectric actuator, so that a working frequency of the piezoelectric actuator is adjusted to an optimum working frequency.

12. The driving system according to claim 11, wherein the control circuit further comprises an output terminal voltage regulator, and the output terminal voltage regulator comprises a fifth resistor and a second capacitor which are connected to each other in parallel, wherein a first terminal of the output terminal voltage regulator is connected to the second voltage generation circuit, a second terminal of the output terminal voltage regulator is connected to the output terminal of the frequency control module, and the output voltage as the switching signal outputted from the frequency control module is stabilized by the output terminal voltage regulator.

13. The driving system according to claim 1, wherein the voltage switching module is electrically connected to an output terminal of the frequency control module, and the voltage switching module comprises:
- a first switch, having a control terminal for receiving the second DC voltage from the voltage conversion module;
- a second switch, having an input terminal and an output terminal both in communication with the first switch, the input terminal connected to the output terminal of the frequency control module, the output terminal connected to the second terminal of the piezoelectric actuator, and the second switch further having a control terminal connected to a ground terminal; and
- a sixth resistor, a first terminal of which is connected to the output terminal of the frequency control module, and a second terminal of which is connected to the second terminal of the piezoelectric actuator.

14. The driving system according to claim 1, wherein the voltage dividing module comprises:
- a seventh resistor, a first terminal of which is electrically connected to the microcontroller to receive the adjusting signal;
- an eighth resistor, a first terminal of which is electrically connected to a second terminal of the seventh resistor, and a second terminal of which is electrically connected to the voltage conversion module; and
- a ninth resistor, a first terminal of which is electrically connected to the second terminal of the eighth resistor, and a second terminal of which is electrically connected to a ground terminal.

* * * * *